US012562198B2

(12) United States Patent　　　　(10) Patent No.:　US 12,562,198 B2
Zlotnik et al.　　　　　　　　　　　(45) Date of Patent:　Feb. 24, 2026

(54) VOLTAGE DOMAIN BASED ERROR MANAGEMENT

(71) Applicant: Micron Technology, Inc., Boise, ID (US)

(72) Inventors: Leon Zlotnik, Camino, CA (US); Leonid Minz, Beer Sheva (IL)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 18/602,782

(22) Filed: Mar. 12, 2024

(65) Prior Publication Data

US 2024/0321380 A1　　Sep. 26, 2024

Related U.S. Application Data

(60) Provisional application No. 63/453,256, filed on Mar. 20, 2023.

(51) Int. Cl.
G11C 5/14　　　　(2006.01)
(52) U.S. Cl.
CPC ..................................... G11C 5/147 (2013.01)
(58) Field of Classification Search
CPC ....................................................... G11C 5/147
See application file for complete search history.

(56) References Cited

U.S. PATENT DOCUMENTS

| | | | |
|---|---|---|---|
| 9,575,882 | B2 | 2/2017 | Nellans et al. |
| 10,824,499 | B2 | 11/2020 | Hu et al. |
| 2003/0155897 | A1* | 8/2003 | Miftakhutdinov ........ G06F 1/26 |
| | | | 323/282 |
| 2008/0219080 | A1* | 9/2008 | Geens .................... G11C 29/50 |
| | | | 365/227 |
| 2009/0016140 | A1* | 1/2009 | Qureshi ............... G11C 29/028 |
| | | | 365/227 |
| 2009/0271678 | A1* | 10/2009 | Schneider ............ G11C 29/028 |
| | | | 714/799 |
| 2010/0019834 | A1* | 1/2010 | Zerbe ........................ G05F 1/10 |
| | | | 327/538 |
| 2019/0115053 | A1* | 4/2019 | Park ..................... G11C 29/028 |
| 2019/0187690 | A1 | 6/2019 | Cella et al. |
| 2019/0392918 | A1* | 12/2019 | Cariello ................. G11C 29/52 |

* cited by examiner

*Primary Examiner* — Joseph D Torres
(74) *Attorney, Agent, or Firm* — Brooks, Cameron & Huebsch, PLLC

(57) ABSTRACT

A method includes supplying, via a voltage regulator, a supply voltage to a first voltage domain and a second voltage domain, detecting a change in an error characteristic of data associated with the second voltage domain, and altering the supply voltage to an altered supply voltage based on the change in the error characteristic.

20 Claims, 6 Drawing Sheets

100

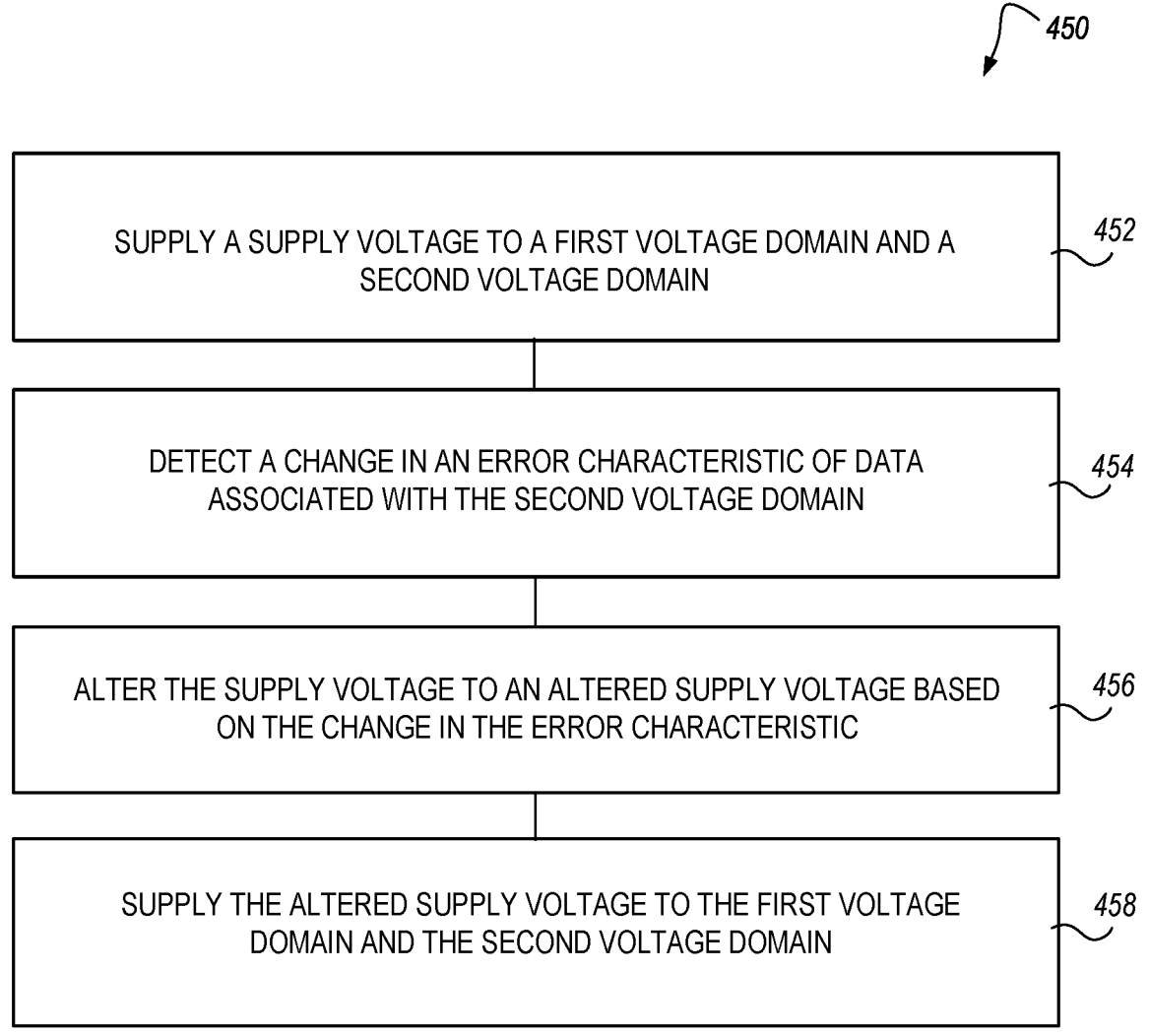

450

SUPPLY A SUPPLY VOLTAGE TO A FIRST VOLTAGE DOMAIN AND A
SECOND VOLTAGE DOMAIN
452

DETECT A CHANGE IN AN ERROR CHARACTERISTIC OF DATA
ASSOCIATED WITH THE SECOND VOLTAGE DOMAIN
454

ALTER THE SUPPLY VOLTAGE TO AN ALTERED SUPPLY VOLTAGE BASED
ON THE CHANGE IN THE ERROR CHARACTERISTIC
456

SUPPLY THE ALTERED SUPPLY VOLTAGE TO THE FIRST VOLTAGE
DOMAIN AND THE SECOND VOLTAGE DOMAIN
458

*FIG. 4*

VOLTAGE DOMAIN BASED ERROR MANAGEMENT

PRIORITY INFORMATION

This Application claims the benefit of U.S. Provisional Application No. 63/453,256, filed on Mar. 20, 2023, the contents of which are incorporated herein by reference.

TECHNICAL INFORMATION

Embodiments of the disclosure relate generally to digital logic circuits and memory devices, and more specifically, relate to voltage domain based error management.

BACKGROUND

Various types of electronic devices such as digital logic circuits and memory systems may store and process data. A digital logic circuit is an electronic circuit that processes digital signals or binary information, which can take on two possible values (usually represented as 0 and 1). The digital logic circuit can use logic gates to manipulate and transform the digital signals or binary information. Digital logic circuits can be, for example, used in a wide range of electronic devices including computers, calculators, digital clocks, and many other electronic devices that employ digital processing. Digital logic circuits can be designed to perform specific logical operations on digital inputs to generate digital outputs, and, in some instances, can be combined to form more complex circuits to perform more complex operations. A memory device can include one or more memory devices that store data. The memory devices can be, for example, non-volatile memory devices and volatile memory devices. In general, a host system can utilize a memory system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 4 is a flow diagram corresponding to a method for voltage domain based error management in accordance with some embodiments of the disclosure.

DETAILED DESCRIPTION

Figure 1:
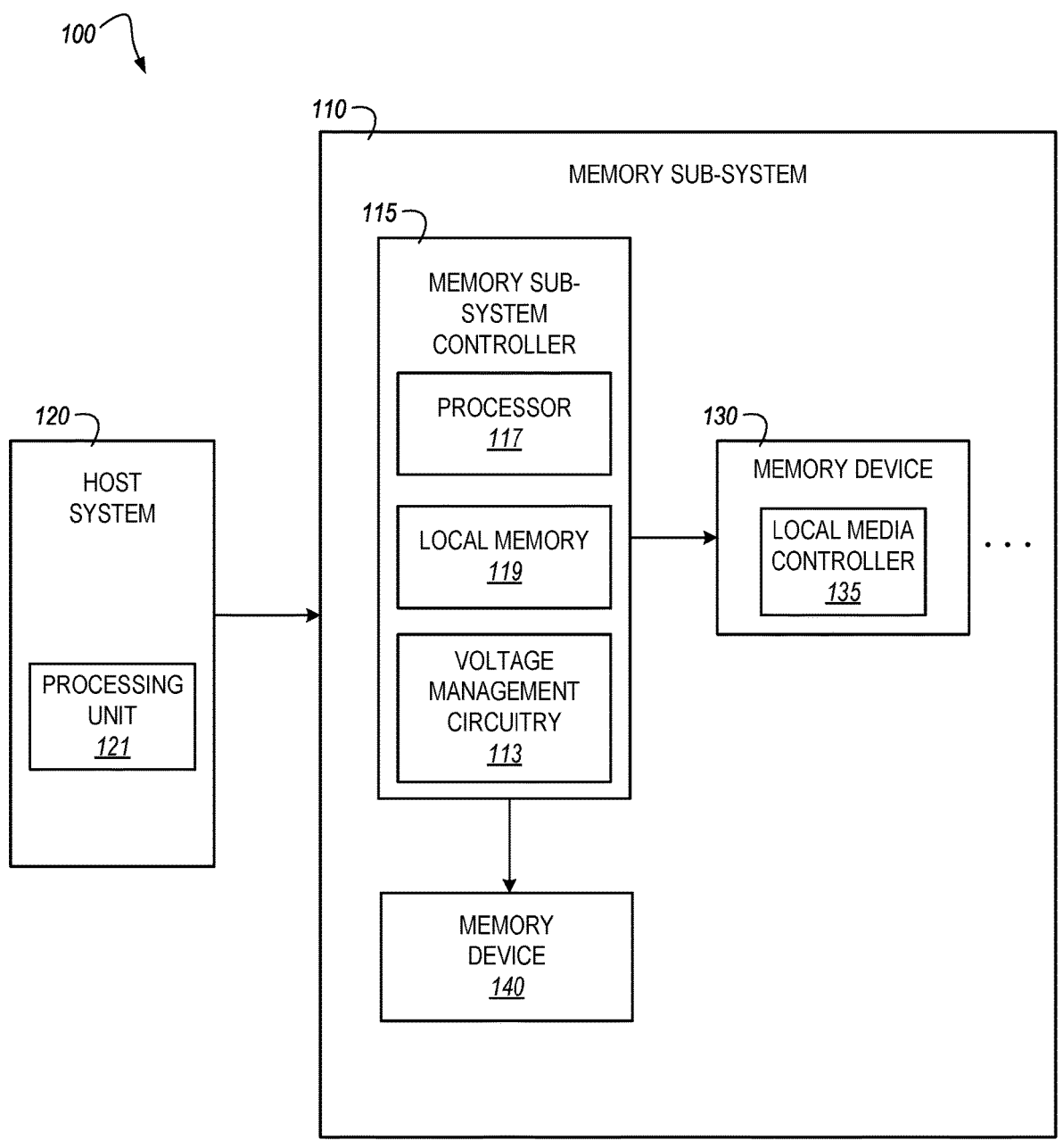
FIG. 1 illustrates an example memory system configured in accordance with some embodiments of the present disclosure.

Aspects of the present disclosure are directed to voltage domain based error management and, in particular to memory systems (e.g., memory sub-systems) that include voltage management circuitry and a voltage regulator associated with a first voltage domain and a second voltage domain, as described herein. The voltage management circuitry may also be referred to as "voltage regulator based error management circuitry" herein.

Electronic devices may include a control path and a data path. The control path generally handles command processing, address translation, data path management, and/or media command interface, among other control operations. For instance, the control path may include control logic (e.g., a finite-state machine, etc.) and/or other circuitry configured to perform control operations such as those described above. The data path generally handles data such as data which is configured to be communicated in accordance with various wired protocols and/or various wireless protocols.

The control path and the data path may have different error tolerances. A used herein an error tolerance refers to a quantity of errors such as a quantity of errors over a period of time at which an apparatus may function as intended. For instance, the data path may be relatively error tolerant. For example, the data path may include various error correction mechanisms (e.g., ECC, LDPC, FEC, etc.) configured to detect and correct errors up to a relatively high error rate (e.g., a bit error rate (BER)<1E-3, <1E-4, <1E-5, <1E-6, or <1E-10, etc.). However, the control path may be less tolerant of errors than the data path and/or may be required to operate in a substantially error-free manner. For example, to ensure that the electronic device functions as intended the control path may be configured to operate in a substantially error-free manner (e.g., having a BER<1E-16, or <1E-17, etc.). That is, the error tolerance of the control path may be many orders of magnitude less than the error tolerance of the data path.

To ensure that the control path operates in the substantially error-free manner, some previous approaches may constrain both the control path and the data path to operate at the same relatively low error rate (e.g., a BER<1E-17). Such approaches may configure a voltage regulator to supply the same relatively high supply voltage to both the control path and the data path. Therefore, such approaches may ensure that circuitry in the control path operates in a substantially error-free manner (e.g., having a BER<1E-17) at least due to being supplied with the relatively high supply voltage.

However, such approaches thereby over-constrain the data path by many orders of magnitude (e.g., by fourteen orders of magnitude in the non-limiting example provided here). A resultant error rate (a BER<1E-17) of the data associated with the data path may be significantly lower than a permissible error rate (e.g., a BER<1E-3) at which the data path could otherwise be satisfactorily operated. Stated differently, the reduction in errors realized by over-constraining the data path may yield no discernable difference in the actual performance of the electronic device (e.g., as the error correction mechanisms are configured to detect and correct a substantially higher quantity of errors).

Yet, the reduction in errors in the data associated with the data path comes at a substantial cost in terms of the amount of power consumed by the electronic device. That is, the amount of power consumed by the data path may far exceed an amount of power associated with operating the data path at or closer to a permissible error rate (e.g., a BER<1E-3). Moreover, in view of the above-mentioned reduction in a quantity of errors, such approaches may retain a large overhead (e.g., in terms of physical space occupied, power consumed by, and/or various error bits, etc.) associated with the underutilized error correction circuitry and/or underutilized error detection circuitry. Additionally, operation of the data path at the high supply voltage may subject components (e.g., logic gates, transistors, etc.) in the data path to higher than necessary voltage levels which may damage or reduce an operation lifetime of the components.

To address the above and other deficiencies, approaches herein employ voltage management circuitry configured to supply, via a voltage regulator, a supply voltage to a first voltage domain including circuitry (e.g., control path circuitry) and a second voltage domain including circuitry (e.g., data path circuitry), detect a change in an error characteristic (e.g., a BER) of data associated with the second voltage domain, alter the supply voltage to an altered supply voltage based on the change in the error characteristic, and supply that altered supply voltage to the first voltage domain and the second voltage domain, as described herein.

For instance, approaches herein may supply the first voltage domain and a second voltage domain with the same supply voltage (e.g., which is less than a nominal voltage of the voltage regulator) and thereby realize a reduction in power consumption by both the first voltage domain and the second domain, as compared to other approaches such as those that supply both the data path and the control path with the same relatively high supply voltage. Yet, the supply voltage and the altered supply voltage may be maintained within a voltage range. For instance, the voltage domains may be supplied with a supply voltage that is included in a voltage zone (e.g., a virtual tolerant voltage zone) including at least some values that are less than the nominal voltage of the voltage regulator. Maintaining the supply voltage (and the altered supply voltage) within the voltage range ensures that the reduction in power consumption results in only a permissible degree of increase in errors associated with the first voltage domain and the second voltage domain. That is, approaches herein realize a synergist balance between a reduction in power utilized by the voltage domains and any increase in a quantity of errors associated with the voltage domains.

Additionally, as mentioned the supply voltage may be altered to the altered supply voltage based on the error characteristics of data associated with the second voltage domain, as described herein. For example, embodiments herein may ensure that the control path in the first voltage domain and the data path in the second voltage domain operate within the voltage zone at a permissible error rate. For instance, a value of the altered supply voltage supplied by the voltage regulator may be negatively correlated to a value of the error characteristic of data associated with the second voltage domain. As used herein, being "negatively correlated" refers to a relationship between two variables such that as one variable increases, the other variable tends to decrease, and vice versa. In other words, there is an inverse relationship between the two variables.

As such, a decrease in the error characteristic (e.g., an increase in BER) can result from an increase (e.g., can cause) in the supply voltage (e.g., a value of the altered supply voltage may be higher than an initial value of the supply voltage). That is, he decrease in the supply voltage may result in a subsequent increase in the error characteristic such as an increase of an error rate. Conversely, an increase in the error characteristic (e.g., an increase in the BER) can result from a decrease in the supply voltage (e.g., a value of the altered supply voltage can be less than an initial value of the supply voltage). That is, the increase in the supply voltage may result in a subsequent decrease in the error characteristic such as a decrease of an error rate. As such, a value of the voltage supplied to the first voltage domain and the second voltage domain by the voltage regulator may be tailored to maintain the error characteristic of the data within a permissible error range and yet reduce to the extent possible an amount of power consumed by the voltage domains.

As used herein, a voltage domain refers to a device or a portion of a device configured to operate at a given voltage (e.g., a given supply voltage). Each voltage domain may have a different set of power bonding pads (e.g., a power pin) and ground bonding pads (e.g., a ground pin) coupled to a voltage rail. A voltage regulator can supply the voltage domains with a given voltage and/or range of voltages. For example, the first voltage domain may include circuitry (e.g., having a particular timing closure) that is configured to operate at a supply voltage supplied via a voltage regulator while other circuitry (e.g., having a different timing closure) in the second voltage domain may be configured to operate at a different supply voltage, as described herein.

In the interest of clarity, embodiments herein will be generally described in relation to electronic devices/circuitry having a given quantity of voltage domains (e.g., two voltage domains), it will be appreciated that embodiments in which a different quantity of voltage domains are contemplated within the scope of the disclosure. In the interest of clarity, embodiments herein will be generally described in relation to a memory device, however, it will be appreciated that embodiments in which other circuitry such as a digital logic circuit, latches, various I/O circuitry, a cache, etc. is utilized are contemplated within the scope of the disclosure.

In some embodiments, the voltage domains can be included in one or more memory resources that are associated with the memory system. A memory system (e.g., memory sub-system) can be a storage system, storage device, a memory module, or a combination of such. An example of a memory sub-system is a storage system such as a solid-state drive (SSD). Examples of storage devices and memory modules are described below in conjunction with FIG. 1, et alibi.

In general, a host system can utilize a memory sub-system that includes one or more components, such as memory devices that store data. The host system can provide data to be stored at the memory sub-system and can request data to be retrieved from the memory sub-system. For instance, during operation of a computing system, data may be written to, and retrieved from the memory sub-system. Some data may be written to persistent memory devices (which can be analogous to or similar to "non-volatile memory" devices) within the memory sub-system for long-term storage, while other data may be written to non-persistent memory devices (which can be analogous to or similar to "volatile" memory devices) within the memory sub-system for quick, short-term retrieval. Still other data may be written to various memory resources and/or caches of the memory sub-system to assist with performance of operations involving the memory sub-system.

For example, various memory resources and/or caches can be utilized during operation of the memory sub-system to provide read caching, write-through caching, write-back caching, and/or write-around caching. In addition, some memory resources and/or caches of the memory sub-system can be allocated to store various tables that are utilized during operation of the memory sub-system. One such example is a logical-to-physical (L2P) table that is used to map logical addresses utilized by a host system to physical addresses of the memory sub-system where data is physically stored. Another such example is a database containing an organized collection of data that is stored within the memory resource and/or cache.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

In other embodiments, the voltage management circuitry 113 can be deployed on, or otherwise included in a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing unit 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include voltage management circuitry 113. Although not shown in FIG. 1 so as to not obfuscate the drawings, the voltage management circuitry 113 can include various circuitry to facilitate aspects of the disclosure described herein. In some embodiments, the voltage management circuitry 113 can include special purpose circuitry in the form of an ASIC, FPGA, state machine, hardware processing device, and/or other logic circuitry that can allow the voltage management circuitry 113 to orchestrate and/or perform operations to provide voltage regulator based error management, particularly with respect to a system-on-chip, in accordance with the disclosure.

In some embodiments, the memory sub-system controller 115 includes at least a portion of the voltage management circuitry 113. For example, the memory sub-system controller 115 can include a processor 117 (processing device) configured to execute instructions stored in local memory 119 for performing the operations described herein. In some embodiments, the voltage management circuitry 113 is part of the host system 110, an application, or an operating system. The voltage management circuitry 113 can be resident on the memory sub-system 110 and/or the memory sub-system controller 115. As used herein, the term "resident on" refers to something that is physically located on a particular component. For example, the voltage management circuitry 113 being "resident on" the memory sub-system 110, for example, refers to a condition in which the hardware circuitry that comprises the voltage management circuitry 113 is physically located on the memory sub-system 110. The term "resident on" may be used interchangeably with other terms such as "deployed on" or "located on," herein.

Figure 2A:
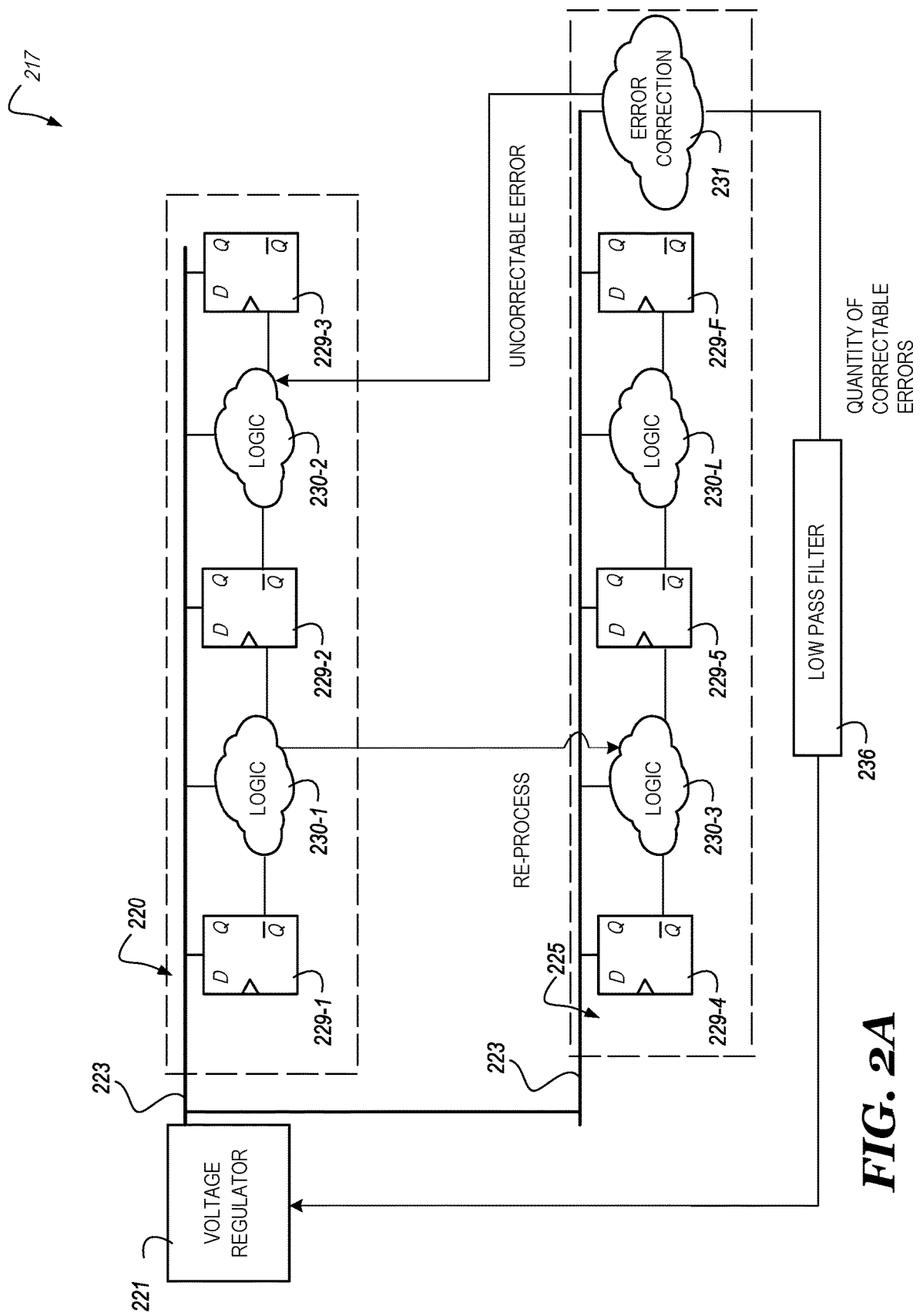
FIG. 2A illustrates an example diagram of an apparatus suitable for voltage domain based error management in accordance with some embodiments of the present disclosure.
Figure 2B:
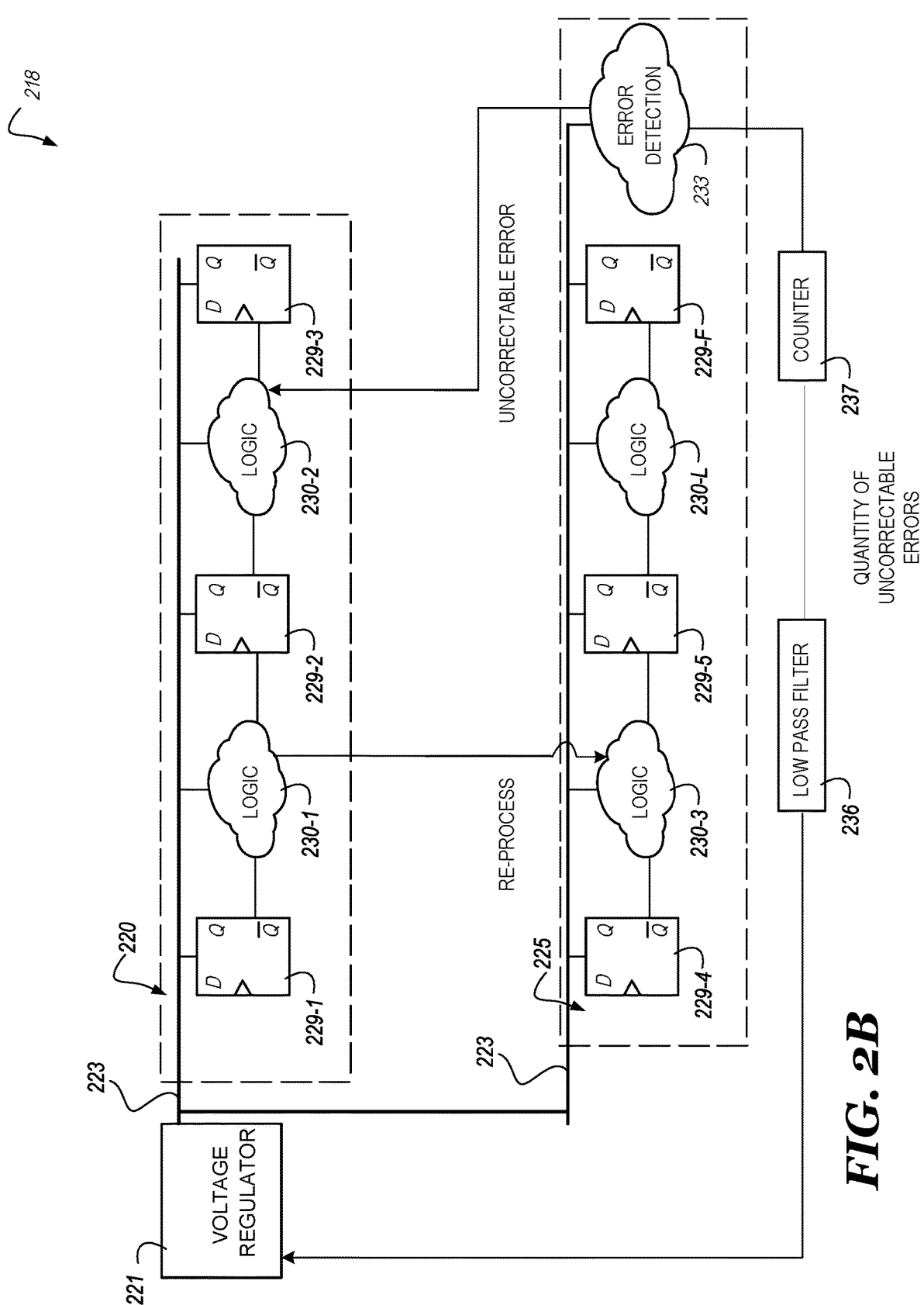
FIG. 2B illustrates an example diagram of another apparatus suitable for voltage domain based error management in accordance with some embodiments of the present disclosure.

FIG. 2A illustrates an example diagram of an apparatus 217 suitable for voltage domain based error management in accordance with some embodiments of the present disclosure. FIG. 2B illustrates an example diagram of another apparatus 218 suitable for voltage domain based error management in accordance with some embodiments of the present disclosure. The elements in FIG. 2B can be analogous to the elements of FIG. 2A, with the distinction that FIG. 2B includes a counter and further includes error detection circuitry instead of the error detection and error correction circuitry included in FIG. 2A.

As illustrated in FIG. 2A and FIG. 2B, each of the apparatus 217 and the apparatus 218 includes a plurality of different voltage domains (e.g., two different power domains) represented as a first voltage domain 220 and a second voltage domain 225. Each voltage domain can include respective circuitry. For instance, the first voltage domain 220 may include control path circuitry and the second voltage domain 225 may include data path circuitry. The control path circuitry may be configured to form a control path (e.g., which is configured to operate at a nominal voltage of a voltage regulator) and the data path circuitry may be configured to form a data path (e.g., which is configured to operate in a voltage zone defined by an upper voltage and a lower voltage), as described herein.

In some embodiments, the control path circuitry, the data path circuitry, or both, may have a timing closure (i.e., timing constraint) sufficient to ensure that supply voltage provided to the first voltage domain and the second voltage domain remains within a voltage zone, as described herein. For instance, the control path circuitry may be configured to have a quicker or relatively shorter timing closure than a timing closure of the data path circuitry. In some embodiments the control path circuitry may have a timing closure that is 5%, 10%, or 20%, etc., quicker or relatively shorter (e.g., reduced by a timing closure margin) than a timing closure of the data path circuitry. For example, the timing closure of the control path circuitry may be equivalent to 0.65 volts (e.g., the control path circuitry may have satisfactory timing closure performance when operating at 0.65 volts), while the timing closure of the data path circuitry may be equivalent to 0.80 volts, among other possible values. In such examples, the timing closure margin (e.g., 0.15) between the two voltage domains may ensure that the control path circuitry which has a quicker or relatively shorter timing closure operates within the voltage zone (e.g., in a substantially-error free manner) and yet provides a reduction in an amount of power consumed by the control path circuitry and data path circuitry, as described herein. For instance, the lower voltage value of the voltage zone may be based on a timing closure of the control path circuitry to ensure that that control path circuitry operates in a substantially error-free manner. Generally, the respective timing closures of the control path circuitry and the data path circuitry may be configured via conventional methodologies such as altering a size of a component (e.g., a gate, transistor, flip-flop circuit, etc.) and/or placement of a component in the control path circuitry and the data path circuitry.

The control path circuitry may include flip-flop (FF) circuits such as a first flip-flip (FF) circuit 229-1, a second FF circuit 229-2, and a third FF circuit 229-3 and logic such as a first logic circuit 230-1 and a second logic circuit 230-2. Similarly, the data path circuitry may include FF circuits such as a fourth FF circuit 229-4, a fifth FF circuit 229-5, and a sixth FF circuit 229-F and logic such as a third logic circuit 230-3 and a fourth logic circuit 230-L. FF circuits (e.g., FF) refer to a general-purpose data storage elements that may be used in digital electronic circuitry. FF circuits may be general-purpose clocked storage elements that make sequential and state logic design feasible. FF circuits may store logic states, parameters, and/or digital control signals, etc. Examples of suitable types of flip-flop circuits include D, set, reset, set-reset, JK, toggle enable, and/or scan type FF circuits. The logic circuits can include various logical circuitry such as various types of logical gates configured to perform aspects herein. While FIG. 2A and FIG. 2B illustrate FF and logic circuits, the one or more of the voltage domains may include alternate and/or additional components such as latches, I/O, caches, memory, etc.

Each voltage domain may be coupled to a common voltage rail. As used herein, a common voltage rail refers to an individual voltage rail that couples an individual voltage regulator to a plurality of voltage domains. Having each of the voltage domains coupled via a common voltage rail to a corresponding voltage regulator (an individual voltage regulator) may promote aspects herein. For instance, a voltage regulator 221 may be coupled via a voltage rail 223 in the first voltage domain 220 and the second voltage domain 225. In some embodiments, a controller (e.g., the controller 115 described with respect to FIG. 1) may cause a voltage regulator 221 to supply the supply voltage via the voltage rail 223 to the first voltage domain 220 and may cause the voltage regulator 221 to supply the supply voltage via the voltage rail 223 to the second voltage domain 225. That is, the voltage regulator may be configured to supply substantially the same supply voltage to the first voltage domain and the second voltage domain.

In some embodiments, the controller may cause the voltage regulator 221 to supply an altered supply voltage to the first voltage domain 220 and the second voltage domain 225. For instance, the controller may cause the voltage regulator 221 to supply an altered supply voltage responsive to a change in an error characteristic of data associated with the second voltage domain 225, as described herein. In some embodiments, the voltage regulator may be configured to supply substantially the same altered supply voltage to the first voltage domain and the second voltage domain. As used herein, the term "substantially" intends that the characteristic need not be absolute, but is close enough so as to achieve the advantages of the characteristic. For example, a "substantially equal" is not limited to absolute values. For instance, continuing with the above examples a value of the altered supply voltage provided to the first voltage domain can be within 0.5%, 1%, 2%, or 5%, etc. of a value of the altered supply voltage provided to the second voltage domain.

As illustrated in FIG. 2A, the apparatus 217 may include error detection and error correction circuitry 231 (hereinafter referred to as error correction circuitry 231). Thus, in some embodiments, the apparatus 217 may be configured to detect and correct, via the error correction circuitry 231, a quantity of errors (e.g., correctable errors) in data associated with the second voltage domain 225. For instance, the error correction circuitry 231 may correct a quantity of correctable errors and may subsequently transmit signaling indicative of the quantity of correctable error to a controller and/or a voltage regulator such as the voltage regulator 221.

In some embodiments, a low-pass filter 236 may be configured to receive the signaling indicative of the quantity of correctable errors transmitted by the error correction circuitry 231, as illustrated in FIG. 2A. The low-pass filter 236 may be configured to attenuate (e.g., not transmit or transmit a reduced quantity of errors that is equal to or less than a correctable error threshold) the quantity of correctable errors when the quantity of correctable errors exceeds a correctable error threshold. The correctable error threshold may be a particular value, rate, and/or rate of change in a quantity of errors. Additionally, the low-pass filter 236 may transmit to the controller and/or voltage regulator signaling that is indicative of the quantity of correctable errors when the quantity of correctable errors is less than or equal to the correctable error threshold. In this way, the low-pass filter may mitigate any abrupt change (e.g., an abrupt change in the value of the altered supply voltage) in the supply voltage supplied by the voltage regulator 221, for instance, when a large quantity of errors is received, and yet may transmit the quantity of errors (when the quantity of errors is less than the error threshold) to permit alteration of the second voltage to the altered supply voltage based on a change in an error characteristic of the data associated with the second voltage domain 225.

In some embodiments, the error correction circuitry 231 may be configured to cause uncorrectable errors (e.g., errors with a magnitude and/or a type of error that is outside of the error correction capabilities of the error correction circuitry 231) to be reprocessed. For instance, the error correction circuitry 231 may detect an uncorrectable error in data associated with the second voltage domain 225. Responsive to detection of the uncorrectable error, the error correction circuitry 231 may transmit signaling indicative of the uncorrectable error and/or an operation which leads to the uncorrectable error, etc., to the first voltage domain 220. The logic in the first voltage domain 220 can cause the data having the uncorrectable error to be reprocessed ("RE-PROCESS") and to be communicated to the second voltage domain 225. Notably, because of operation of the plurality of voltage domains with the individual voltage regulator the approaches herein may employ less circuitry (e.g., an absence of level shifters, etc.) than other approaches such as other approaches that employ a plurality of voltage regulators for a plurality of voltage domains.

Similarly, the apparatus 218 may include error detection circuitry 233, as illustrated in FIG. 2B. The error detection circuitry 233 may be configured to detect but not correct errors. Embodiments employing only error detection circuitry 233 (in the absence of error correction circuitry), as illustrated in FIG. 2B, may yield a further reduction in an amount of power consumed by the second voltage domain 225 as compared to approaches that employ error correction. That is, for at least some types of data reprocessing of the data responsive to detection of an error may utilize less power and/or have less computation overhead than performance of error correction.

As such, responsive to detection of an error (e.g., an uncorrectable error) the error detection circuitry 233 may transmit signaling indicative of the uncorrectable error and/ or an operation which leads to the uncorrectable error, etc. The logic in the first voltage domain 220 may cause the data having the uncorrectable error to be reprocessed and to be communicated to the second voltage domain 225. The error detection circuitry 233 may transmit signaling indicative of the quantity of uncorrectable error detected to a counter 237. The counter may count the quantity of uncorrectable errors. For instance, the counter 237 may be incremented for each error, among other possibilities.

The counter 237 may transmit signaling indicative of the quantity of errors counted by the counter 237 to a low-pass filter 236. The low-pass filter 236 may attenuate the quantity of uncorrectable errors when the quantity of uncorrectable errors exceeds an uncorrectable error threshold. The uncorrectable error threshold may be a particular value, rate, and/or rate of change in a quantity of errors. Additionally, the low-pass filter 236 may transmit to the controller and/or voltage regulator 221 signaling that is indicative of the quantity of uncorrectable errors when the quantity of uncorrectable errors is less than or equal to the uncorrectable error threshold.

In some embodiments, the controller may receive signaling indicative of a quantity of errors in data associated with the second voltage domain 225. The quantity of errors may include a quantity of uncorrectable errors and/or a quantity of correctable errors. For instance, the apparatus 217 may transmit signaling indicative of a quantity of correctable errors, as illustrated in FIG. 2A, while the apparatus 218 may transmit signaling indicative of a quantity of uncorrectable errors, as illustrated in FIG. 2B, among other possibilities.

In some embodiments, the controller may determine, based on the signaling indicative of the quantity of errors, an error characteristic such as a BER of the data associated with the second voltage domain 225. In some embodiments, the controller may be configured to cause the voltage regulator 221 to alter, based on a change in the error characteristic (e.g., BER), the supply voltage to an altered supply voltage that is supplied via the common voltage rail to each of the first voltage domain 220 and second voltage domain 225.

While FIG. 2A and FIG. 2B illustrate particular quantities of FF circuits, logic circuits, voltage domains, and voltage rails, etc., the quantity of quantities of FF circuits, logic circuits, voltage domains, and/or voltage rails, etc. illustrated in FIG. 2A and FIG. 2B may be varied.

Figure 3:
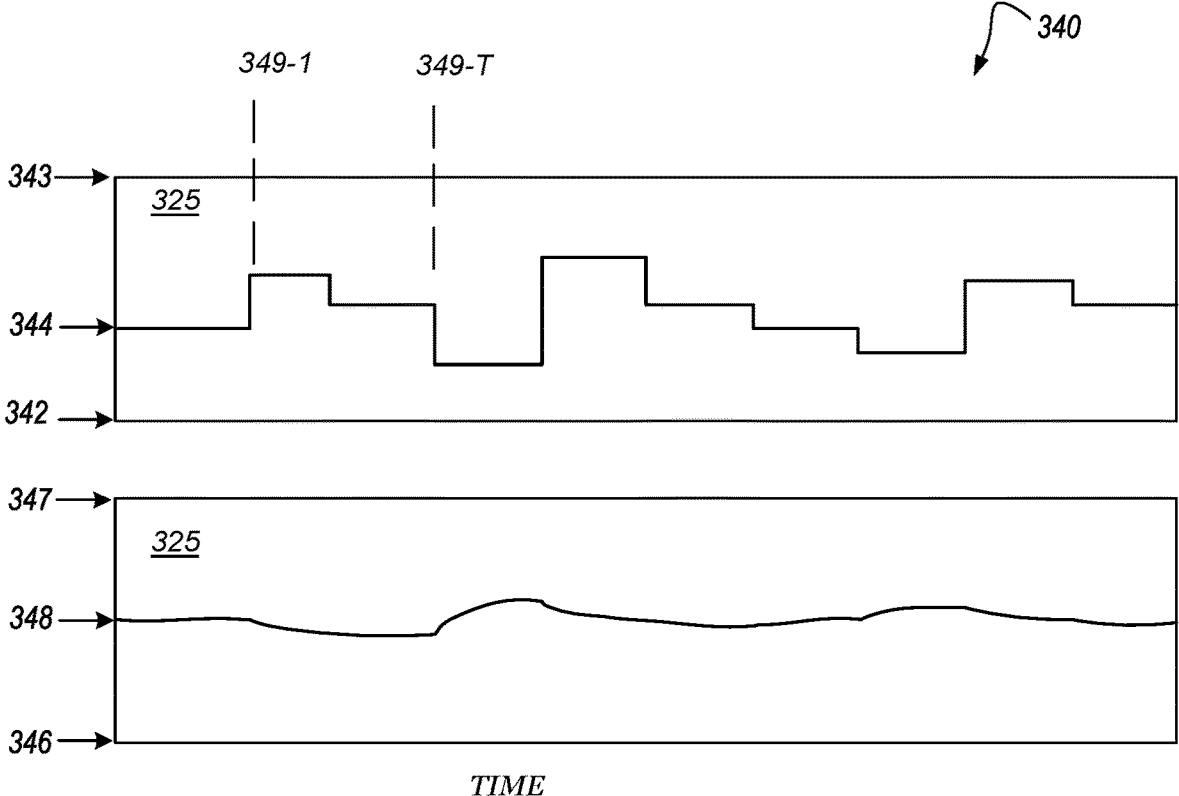
FIG. 3 illustrates a representation of an example timing diagram illustrating aspects of voltage domain based error management in accordance with some embodiments of the present disclosure.

FIG. 3 illustrates an example timing diagram 340 illustrating aspects of voltage domain based error management in accordance with some embodiments of the present disclosure. As illustrated in FIG. 3, a value of error characteristic 344 of data associated with a second voltage domain 325 and a value of a supply voltage (represented by 348) supplied to the second voltage domain 325 can vary over time. For instance, the error characteristic 344 may vary based on change in the supply voltage supplied to circuitry (e.g., data path circuitry) and logic in the second voltage domain 325. As such, embodiments herein provide a supply voltage provided by the voltage regulator may be altered to an altered supply voltage based on a change in the error characteristic. For example, a decrease in the supply voltage supplied to the second voltage domain 325 may cause an increase in the error characteristic (e.g., an increase in an error rate of the data associated with the second voltage domain). Conversely, an increase in the supply voltage supplied to the second voltage domain 325 may cause a decrease in the error characteristic. That is, the change in the error characteristic may be negatively correlated to a change in a supply voltage.

In some embodiments, a value of the supply voltage supplied by the voltage regulator may be altered, as described herein, to maintain the error characteristic of the data within a permissible error range and yet reduce to the extent possible an amount of power consumed by the second voltage domain 325 (and similarly reduce an amount of power consumed by the first voltage domain). For instance, the supply voltage supplied by the voltage regulator to the second voltage domain 325 may be altered within a voltage zone extending from a lower voltage 346 to an upper voltage 347. Stated differently, the lower voltage 346 and the upper voltage 347 can define the voltage zone.

The voltage zone may include at least some values that are less than a nominal voltage (e.g., 0.8 volts) of a voltage regulator. For instance, while the upper voltage 347 may be equal to a nominal voltage (0.8 volts) of a voltage regulator, the lower voltage 346 may be equal to a value (e.g., 0.65 volts) that is less than the nominal voltage. In some embodiments, the lower voltage 346 may have a value that is less than the nominal voltage but is still sufficiently high (e.g., 0.65 volts, 0.70 volts, etc.) to ensure that the circuitry in the first voltage domain, the second voltage domain 325, or both, yields accurate data with a sufficient reliability (e.g., exhibits an error characteristic that is less than an upper error value 343).

In some embodiments, the lower voltage 346, the upper voltage 347, or both, may be variable. For instance, the lower voltage 346 may be varied based on a type of the data associated with the second voltage domain 325, a grade of an apparatus, an operational temperature of the apparatus, an age of the apparatus, a variation in a nominal voltage of the voltage regulator, or any combination thereof. For example, the lower voltage 346 may be decreased when the type of data is data (e.g., WI-FI data, BLUETOOTH data, etc.) communicated in accordance with a wireless protocol and the lower voltage 346 may be increased when the type of data is communicated in accordance with a wired protocol (e.g., DDR5, etc.). For instance, WI-FI data and/or BLUETOOTH data may be relatively error tolerant (e.g., having a BER<1E-6), gigabit passive optical network (GPON) data may be less error tolerant (e.g., having a BER<1E-10), and wired local area network (LAN) data, for instance, operating in accordance with TCP/IP protocol, may operate in a substantially error free manner (e.g., may reprocess any errors), among other possibilities. Stated differently, WI-FI data and/or BLUETOOTH data may permit a lower voltage to be employed due to the relatively high error tolerance of WI-FI data and/or BLUETOOTH data, as compared to other types of data such as GPON data, LAN data, etc. Alternatively, or in addition, a particular grade of an apparatus may have different reliability requirements such as a commercial grade apparatus have a different (e.g., higher reliability requirement) than a consumer grade apparatus.

As mentioned, a value of the altered supply voltage supplied by the voltage regulator may be negatively correlated to a value of the error characteristic of data associated with the second voltage domain. As such, a value of the supply voltage may be altered to an altered supply voltage (with a different value than the initial supply voltage) to selectively increase or decrease a value of the error characteristic. For example, at a first time (represented by 349-1), an increase in the error characteristic 344 can result from a decrease in the supply voltage 348. Thus, responsive to an increase in the error characteristic (e.g., an increase in BER), some embodiments may increase a supply voltage (e.g., such that a value of the altered supply voltage is greater than a value of the supply voltage that was previously supplied by the voltage regulator). The supply voltage increase may cause a decrease in the error characteristic. However, at a second time (represented by 349-T), a decrease in the error characteristic 344 can result from an increase in the supply voltage 348. Accordingly, the value of the error characteristic 344 can be maintained in the permissible error zone extending from an upper error value 343 to a lower error value 342.

Maintaining the value of the error characteristic 344 in the reliability zone (e.g., permissible region) may yield a significant savings in power consumption by the data path in the second voltage domain and yet still ensure that a quantity of errors is maintained at an acceptable level (e.g., at which the apparatus may operate without or with error correction/detection mechanisms configured to detect/correct the quantity of errors). Though for clarity, during actual operation a quantity of an error characteristic may temporarily (e.g., for a short duration of time) exceed the upper error value 343 and/or may temporarily be below the lower error value 342 without departing from the scope of the present disclosure. Similarly, during actual operation a value of the supply voltage may temporarily exceed the upper supply voltage value and/or may temporarily be below the lower error value 342 without departing from the scope of the present disclosure.

In some embodiments, the lower error value 342 and the upper error value 343 may be larger than a value (e.g., a BER<1E-17) of an error characteristic associated with the first voltage domain. For instance, in some embodiments, upper error value 343 may be substantially equal to a maximum permissible number of errors and/or a maximum permissible error rate (e.g., BER<1E-3) that the error correction/detection circuitry of the second voltage domain are configured to operate at. For instance, the upper error value 343 may have a value that is less than the maximum permissible number of errors and/or the maximum permissible error rate that the error correction/detection circuitry but is still larger than a value of the error characteristic associated with the first voltage domain.

In some embodiments, the lower error value 342 may be a value that is less than the upper error value 343. For instance, lower error value 342 may be a value that is less than the upper error value and is larger than a value of the error characteristic associated with the first voltage domain. In some embodiments, the lower error value 342 can be one or more orders of magnitude less than a value of the upper error value 343. For instance, the upper error value 343 may be a given magnitude (e.g., a BER<1E-3) and the lower error value 342 may have a value (e.g., a BER<1E-4) that is less than the value of the upper error characteristic, among other possibilities. Having the upper error value 343 be substantially equal to a maximum permissible number of errors and/or a maximum permissible error rate (e.g., BER<1E-3) at which the error correction/detection circuitry of the second voltage domain are configured to operate while also having the lower error value 342 be within an order of magnitude (e.g., a BER<1E-4) may yield a large reduction in the power consumption by the data path in the second voltage domain and yet still ensure that a quantity of errors associated with data in the second voltage domain (e.g., the data path) is maintained at an acceptable level.

FIG. 4 is a flow diagram corresponding to a method 450 for voltage domain based error management in accordance with some embodiments of the disclosure. The method 450 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 450 is performed by the voltage management circuitry 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 452, the method 450 includes supplying, via a voltage regulator, a supply voltage to a first voltage domain and a second voltage domain. In some embodiments, the voltage supplied to the first voltage domain can be the same or substantially the same as the voltage supplied to the second voltage domain. For instance, the method 450 may include supplying the supply voltage via a common voltage rail to both the first voltage domain and the second voltage domain, as described herein. The supply voltage may be within a voltage zone, as described herein. Supplying the same or substantially the same supply voltage (and altered supply voltage, as detailed herein) to the first voltage domain and the second voltage that is within a voltage zone may increase a quantity of errors in the data associated with the first voltage domain (e.g., the control path) to a permissible degree in exchange for a substantial reduction in the amount of power consumed by the control path circuitry and the data path circuitry (e.g., as compared to other approaches such as those that constrain both the control path and the data path to a relatively large supply voltage at all times).

At operation 454, the method 450 includes detecting a change in an error characteristic of data associated with the second voltage domain. Detection of the change in the error characteristic of the data can be based on a quantity of errors detected and/or a quantity of error corrected, among other possibilities. For instance, the error characteristic may be a BER or raw-bit error rate of the data associated with the second voltage domain. For example, a BER of data associated with the second voltage domain (e.g., with the data path) may be determined based on the quantity of errors (e.g., uncorrectable and/or correctable errors) detected and/ or a quantity of errors corrected over a period of time as is conventionally known.

At operation 456, the method 450 includes altering the supply voltage to an altered supply voltage based on the change in the error characteristic (as determined at operation 454). In some embodiments, the supply voltage and the altered supply voltage may each be included in the voltage zone, as described herein. In some embodiments, the altered supply voltage may be a voltage within the voltage zone that corresponds to an error rate that is substantially equal to (e.g., within 5 percent, 10 percent, etc.) but does not go below a lower error value of a permissible error zone. Such embodiments may yield enhanced resultant decrease in power consumption by an electronic device such as digital logic circuit, a memory device, etc., and yet ensures that the error characteristic does not extend below the lower error value of a permissible error zone.

As mentioned, a value of the altered supply voltage may be negatively correlated to the change in the error characteristic of the data. For instance, an increase in the error characteristic may result from (e.g., correspond to) a decrease in a supply voltage (e.g., when the value of the altered supply voltage is less than the initial supply voltage). Stated differently, the altered supply voltage may be less than the supply voltage to cause an increase in the error characteristic (and cause a resultant decrease in power consumption and ensure that the error characteristic does not go below the lower error value 342, as described in FIG. 3). Conversely, a decrease in the error characteristic may result from an increase in a supply voltage (e.g., when the value of the altered supply voltage is larger than a value than the initial supply voltage). Stated differently, the altered supply voltage may be larger than the initial supply voltage to cause a decrease in the error characteristic, for instance to ensure that the error characteristic is maintained within the permissible error zone (e.g., does not exceed the upper error value 343, as described in FIG. 3).

At operation 458, the method 450 includes supplying the altered supply voltage to the first voltage domain and the second voltage domain. In some embodiments, the altered voltage supplied to the first voltage domain can be the same or substantially the same supply voltage to both the first voltage domain and the second voltage domain via a common voltage rail, as described herein. The supply voltage may be voltage supplied to the second voltage domain. For instance, method 450 may include supplying the altered supply voltage (e.g., the same or substantially the same altered supply voltage) to the first voltage domain and the second voltage domain via a common voltage rail, as described herein.

Figure 5:
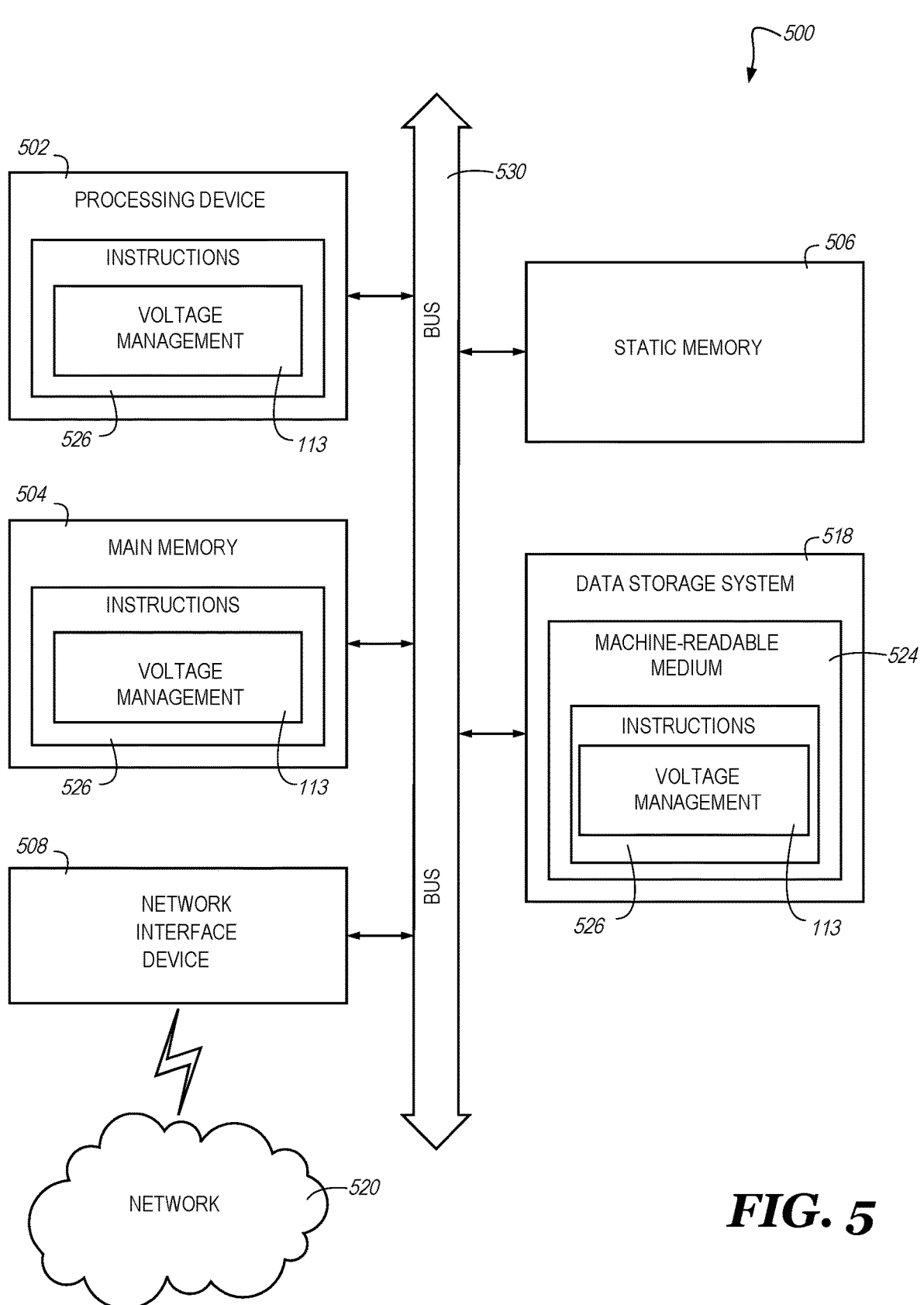
FIG. 5 is a block diagram of an example computer system that includes a memory device in accordance with some embodiments of the present disclosure.

FIG. 5 is a block diagram of an example computer system in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage management circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to voltage management circuitry (e.g., the voltage management circuitry 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
supplying, via a voltage regulator, a supply voltage to a first voltage domain and a second voltage domain;
detecting a change in an error characteristic of data associated with the second voltage domain;
altering the supply voltage to an altered supply voltage based on the change in the error characteristic; and
supplying, via the voltage regulator, the altered supply voltage to the first voltage domain and the second voltage domain.

2. The method of claim 1, wherein the error characteristic is a bit error rate (BER) of the data.

3. The method of claim 1, wherein a value of the altered supply voltage is negatively correlated to the change in the error characteristic of the data.

4. The method of claim 3, wherein:
the altered supply voltage is higher than the supply voltage when the change is a decrease in a value of the error characteristic; and
the altered supply voltage is less than the supply voltage when the change is an increase in a value of the error characteristic.

5. The method of claim 1, further comprising supplying the supply voltage via a common voltage rail to the first voltage domain and the second voltage domain.

6. The method of claim 1, wherein the supply voltage and the altered supply voltage are included in a voltage zone defined by an upper voltage and a lower voltage, and wherein a value of the lower voltage is determined based on a timing closure exhibited by circuitry in the first voltage domain.

7. The method of claim 1, wherein the lower voltage, the upper voltage, or both, are variable, wherein the lower voltage, the upper voltage, or both, varies based on a type of the data, an operational temperature of the apparatus, an age of the apparatus, a variation in a nominal voltage of the voltage regulator, or any combination thereof.

8. An apparatus, comprising:
a voltage regulator;
a first voltage domain including circuitry configured to operate in a voltage zone;
a second voltage domain including circuitry configured to operate in the voltage zone; and
a controller configured to:
cause the voltage regulator to supply a supply voltage to the first voltage domain and the second voltage domain;
detect a change in an error characteristic of data associated with the second voltage domain; and
responsive to detection of the change, cause the voltage regulator to supply an altered supply voltage to the first voltage domain and the second voltage domain, wherein a value of the altered supply voltage is negatively correlated to the change in the error characteristic of the data.

9. The apparatus of claim 8, wherein the voltage regulator is an individual voltage regulator coupled via a common voltage rail to the first voltage domain and the second voltage domain.

10. The apparatus of claim 8, further comprising error detection circuitry configured to detect uncorrectable errors in the data associated with the second voltage domain.

11. The apparatus of claim 10, wherein the controller is configured to reprocess portions of the data that are associated with the uncorrectable errors.

12. The apparatus of claim 8, wherein the circuitry in the first voltage domain is control path circuitry configured to form a control path.

13. The apparatus of claim 12, wherein the circuitry in the second voltage domain is data path circuit configured to form a data path.

14. The apparatus of claim 13, wherein the control path circuitry in the first voltage domain exhibits a first timing closure that is less than a second timing closure exhibited by the data path circuitry in the second voltage domain.

15. A system, comprising:
a voltage regulator;
a first voltage domain including control path circuitry configured to operate in a voltage zone with a supply voltage of the voltage regulator;
a second voltage domain including data path circuitry configured to operate in the voltage zone, wherein the voltage zone is defined by an upper voltage and a lower voltage; and
a controller configured to:
cause the voltage regulator to supply a supply voltage included in the voltage zone to the first voltage domain and the second voltage domain;
receive signaling indicative of a quantity of errors in data associated with the second voltage domain;
determine, based on the signaling indicative of the quantity of errors, a change in an error characteristic of the data;
based on the change in the error characteristic, cause the voltage regulator to alter the supply voltage to an altered supply voltage; and
supply the altered supply voltage to the first voltage domain and the second voltage domain.

16. The system of claim 15, further comprising a common voltage rail coupling the first voltage domain and the second voltage domain to the voltage regulator.

17. The system of claim 15, wherein the quantity of errors includes a quantity of correctable errors, and wherein the second voltage domain includes error correction circuitry configured to detect and correct the quantity of the correctable errors.

18. The system of claim 17, further comprising a low-pass filter configured to:
attenuate the quantity of correctable errors when the quantity of correctable errors exceeds a correctable error threshold; and
transmit to the controller signaling that is indicative of the quantity of correctable errors when the quantity of correctable errors is less than or equal to the correctable error threshold.

19. The system of claim 15, wherein the quantity of errors includes a quantity of uncorrectable errors, and wherein the second voltage domain includes:
error detection circuitry configured to detect the quantity of the uncorrectable errors; and
a counter to count the quantity of the uncorrectable errors.

20. The system of claim 19, further comprising a low-pass filter configured to:
attenuate the quantity of uncorrectable errors when the quantity of uncorrectable errors exceeds an uncorrectable error threshold; and
transmit to the controller signaling indicative of the quantity of uncorrectable errors when the quantity of uncorrectable errors is less than or equal to the correctable error threshold.

* * * * *